United States Patent [19]

Kinoshita

[11] Patent Number: 4,581,740
[45] Date of Patent: Apr. 8, 1986

[54] TRANSFER CIRCUIT FOR DEFECT INSPECTION OF AN INTEGRATED CIRCUIT

[75] Inventor: Tsuneo Kinoshita, Tokyo, Japan

[73] Assignee: Tokyo Shibaura Denki Kabushiki Kaisha, Kawasaki, Japan

[21] Appl. No.: 564,194

[22] Filed: Dec. 22, 1983

[30] Foreign Application Priority Data

Dec. 27, 1982 [JP] Japan ................. 57-226965

[51] Int. Cl.⁴ .............................. G01R 31/28
[52] U.S. Cl. ................. 371/25; 324/73 AT; 377/54
[58] Field of Search ........... 377/54, 64, 69; 371/20, 371/21, 25; 324/73 R, 73 AT

[56] References Cited

U.S. PATENT DOCUMENTS

| | | | |
|---|---|---|---|
| 3,311,890 | 3/1967 | Waaben | 371/21 |
| 3,439,343 | 4/1969 | Stahle | 371/21 |
| 3,940,601 | 2/1976 | Henry et al. | 371/20 |
| 3,967,103 | 6/1976 | Cachuela et al. | 371/25 |

OTHER PUBLICATIONS

Defensive Publication No. T930,005, Issued Jan. 7, 1975 to D. K. Chia et al.

Primary Examiner—John S. Heyman
Assistant Examiner—Karl Ohralik
Attorney, Agent, or Firm—Cushman, Darby and Cushman

[57] ABSTRACT

A logic circuit is formed on a gate array chip together with a custom-circuit. Bonding pads mounted on the gate array chip are used as the terminals which send forth or receive data and control signals. The logic circuit is provided with a shift register for holding data to test the flip-flops of the custom-circuit and output data from the flip-flops. The shift register comprises the stages each of which holds 1-bit data selected by a read control signal. The output terminals of the stages are respectively connected to the input terminals of the flip-flops of the custom-circuit through the AND gates which are rendered conducting in response to a set control signal. The output terminals of the flip-flops are connected to the input terminals of the respective stages of the shift register.

11 Claims, 4 Drawing Figures

TRANSFER CIRCUIT FOR DEFECT INSPECTION OF AN INTEGRATED CIRCUIT

BACKGROUND OF THE INVENTION

This invention relates to a logic circuit formed on a single semiconductor chip together with a custom-circuit in order to detect the defects of an LSI unit (hereinafter simply referred to as the LSI).

It has become possible to manufacture a custom-circuit LSI in an extremely short time of about 2 to 3 months by the use of a gate array. Recently, therefore, the application of the gate array has been rapidly disseminated. The gate array is a semiconductor chip constructed by arranging a large number of logic cells (e.g., 2-input NAND or NOR gates) in a matrix. The logic cells can be interconnected with a dedicated metal pattern to form a custom-circuit logic function on the chip. The general user selects a gate array having a proper number of logic cells in accordance with the scale of a custom-circuit to be integrated, and designs a particular metal pattern. The manufacture produces a gate array in conformity to the metal pattern designed by the user. In this case, the manufacture furnishes a macro cell pattern for the formation of the respective circuit elements, for example, flip-flop, decoders, adders multiplexers, etc. Consequently, a considerable decrease is realized in a period of time required for the development of the LSI as compared with the case where the LSI is produced without using a gate array. A gate array of the same specification can be applied in common to the custom-circuit LSI units of the various types as a base complement. Therefore, the cost of developing a gate array is reduced by that extent. Where, therefore, the custom-circuit LSI is manufactured in a number of amount 2000 to 3000, the gate array offers the advantage of being provided at low cost.

However, the gate array has the drawbacks that a limitation is imposed on the integration of logic cells in order to allow a wider range for their interconnection. Use of the logic cells constituting a gate array unavoidably requires the use of an extensive metal pattern.

In the defect inspection of the LSI, data on its operation speed and logic function are supplied to a custom-circuit involved in the LSI through bonding pads formed along the peripheral edge of the outer surface of the chip. Determination is made of whether the custom-circuit has made a response to the received data, and further in this case measurement is made of the contents of said response. Where the custom-circuit, for example, the CPU involves a plurality of flip-flops, a tremendous amount of data has to be supplied to check the operation of said CPU. Complications in determining various test items and carrying out such tests have hitherto imposed a tremendous load on the user designer.

A level sensitive scan design (LSSD) may be cited as a known device for facilitating the test. The circuit of the LSSD causes plural flip-flops included in the custom-circuit to respectively act as a shift register. However, the LSSD circuit which involves a large number of signal lines and circuit elements is not adapted to be formed on a gate array chip together with the custom-circuit. The reason is that the formation of the LSSD circuit on the gate array chip considerably reduces a region allowed for the provision of the custom-circuit; and the signal lines of the custom-circuit have often to detour around the LSSD circuit, thereby probably decreasing the operation speed of the custom-circuits.

SUMMARY OF THE INVENTION

It is accordingly the object of this invention to provide a logic circuit capable of facilitating the process of examining a custom-circuit LSI.

To attain the above-mentioned object, this invention provides a logic circuit which comprises a data input terminal supplied with a series of data to test logic elements, a first control terminal supplied with a first control signal, a second control terminal supplied with a second control signal, a shift register for temporarily holding test data from the data input terminal and output data from the logic elements, a first transferring circuit for delivering test data held in the shift register in parallel to the respective logic elements in response to the first control signal from the first control terminal, a second transferring circuit for supplying output data from the logic elements in parallel to the shift register in response to the second control signal from the second control terminal, and a data output terminal to which the data held in the shift register are issued in series.

DETAILED DESCRIPTION OF THE PREFERRED EMBODIMENT

Figure 1:
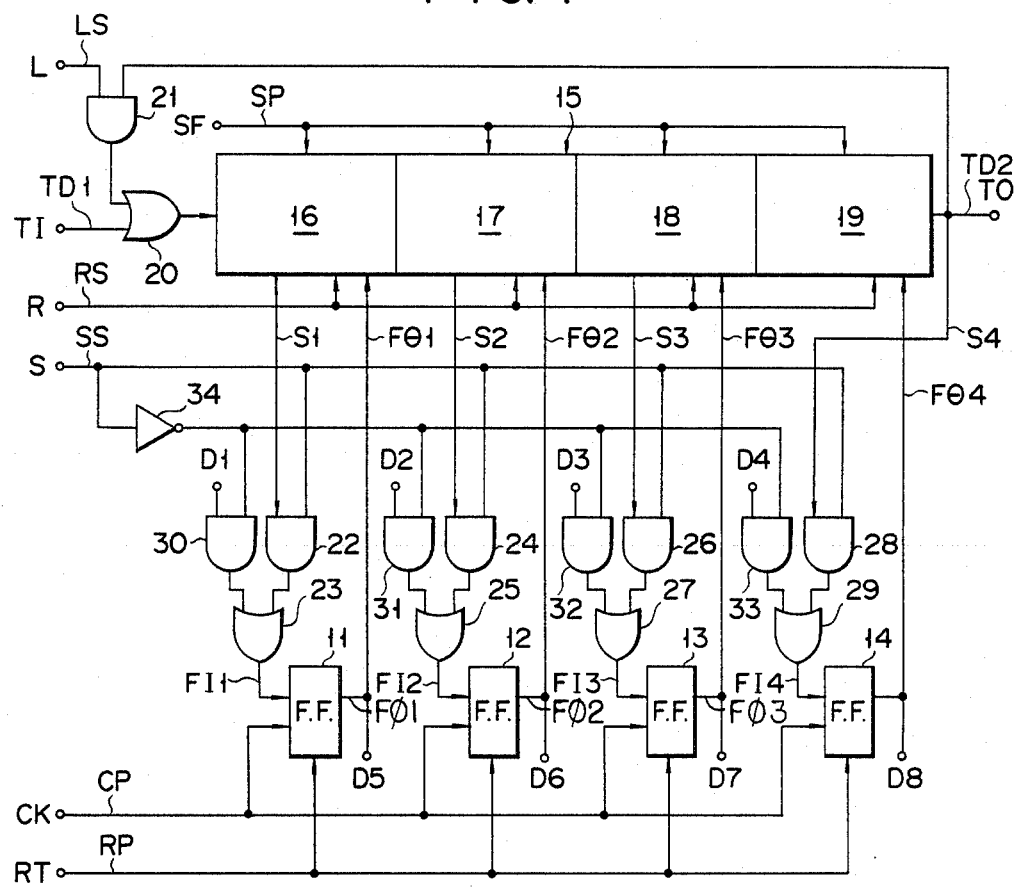
FIG. 1 is a block diagram of a logic circuit embodying this invention.

FIG. 1 shows the arrangement of a logic circuit embodying this invention. The logic circuit is formed on a gate array chip (not shown) together with a custom-circuit whose operation is to be tested. Bonding pads provided along the peripheral edge of the outer surface of the gate array chip are used as terminals TI, TO, S, R, L, CK, SF, RT. The logic circuit is provided with shift register 15 having four stages 16 to 19 in a number corresponding to that of the flip-flops (for example, RS flip-flops) 11 to 14 of the custom-circuit. Each of the stages 16 to 19 comprises first and second input terminals, a selection terminal, a clock terminal, and a output terminal, and can hold one-bit data. The output signals of stages 16 to 19 are designated S1–S4, respectively. The first input terminal of stage 16 is connected to the data input terminal TI through an OR gate 20. The data input terminal TI is supplied with a series of test data for examining the flip-flops 14 to 11 involved in the custom-circuit. The selection terminals of the stages 16 to 19 are connected to the terminal R supplied with a read control signal. The clock terminals of the stages 16 to 19 are connected to the terminal SF supplied with shift pulses. The first input terminals of the stages 17 to 19 are respectively connected to the output terminals of the stages 16 to 18 in the shift register 15. The output terminal of the stage 19 is connected to the data output terminal TO and also to the first input terminal of the stage 16 through AND gate 21 and OR gate 20 in turn. AND gate 21 allows the passage of data upon receiving a loop control signal from the terminal L. The output terminal of the stage 16 is connected to the input terminal of the flip-flop 11 through AND gate 22 and OR gate 23 in turn. The output terminal of the stage 17 is connected to the input terminal of the flip-flop 12 through an AND gate 24 and OR gate 25 in turn. The output terminal of the stage 18 is connected to the input terminal of the flip-flop 13 through AND gate 26 and OR gate 27 in turn. The output terminal of the stage 19 is connected to the input terminal of the flip-flop 14 through an AND gate 28 and OR gate 29 in turn. Each of the AND gates 22, 24, 26, 28 allows the passage of data upon receiving a set control signal from the terminal S. Terminals D1 to D4 are respectively provided with data produced in the customcircuit. The terminal D1 is connected to the input terminal of the flip-flop 11 through an AND gate 30 and OR gate 23 in turn. The terminal D2 is connected to the input terminal of the flip-flop 12 through an AND gate 31 and OR gate 25. The terminal D3 is connected to the input terminal of the flip-flop 13 through an AND gate 32 and OR gate 27 in turn. The terminal D4 is connected to the input terminal of the flip-flop 14 through an AND gate 33 and OR gate 29 in turn. Each of the AND gates 30 to 33 prevents the passage of data upon receipt of a set control signal from the terminal S through an inverter 34. The output terminals of the flip-flops 11 to 14 are respectively connected to terminals D5 to D8 through which output data are supplied to the custom-circuit and also to the second data input terminals of the stages 16 to 19 of the shift register 15. The output signals of flip-flops 11–13 are respectively designated F01–F03. A clock pulse is supplied to the flip-flops 11 to 14 through a terminal CK. A reset pulse is supplied to the flip-flops 11 to 14 through a terminal RT.

Figure 2:
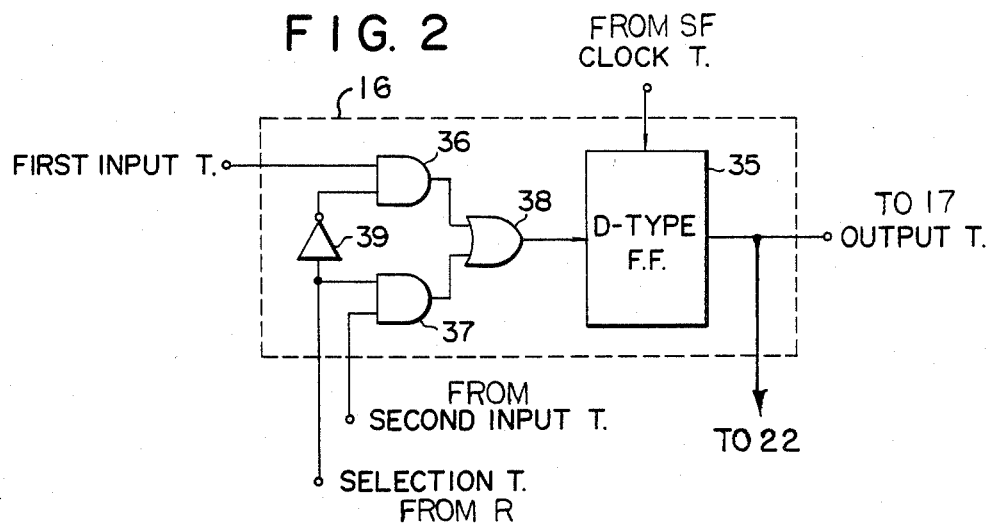
FIG. 2 shows one of the stages shown in FIG. 1.

FIG. 2 indicates the stage 16 in detail. The other stages 17 to 19 have the same structure as the stage 16. The stage 16 includes for example, a D-type flip-flop 35. The input terminal of the D-type flip-flop 35 is connected to the output terminals of AND gates 36, 37 through an OR gate 38. The AND gates 36 and 37 receive one-bit data via the respective first and second input terminals. A read control signal is supplied to an AND gate 36 via the selection terminal and an inverter 39 and to an AND 37 via the selection terminal.

Figure 3:
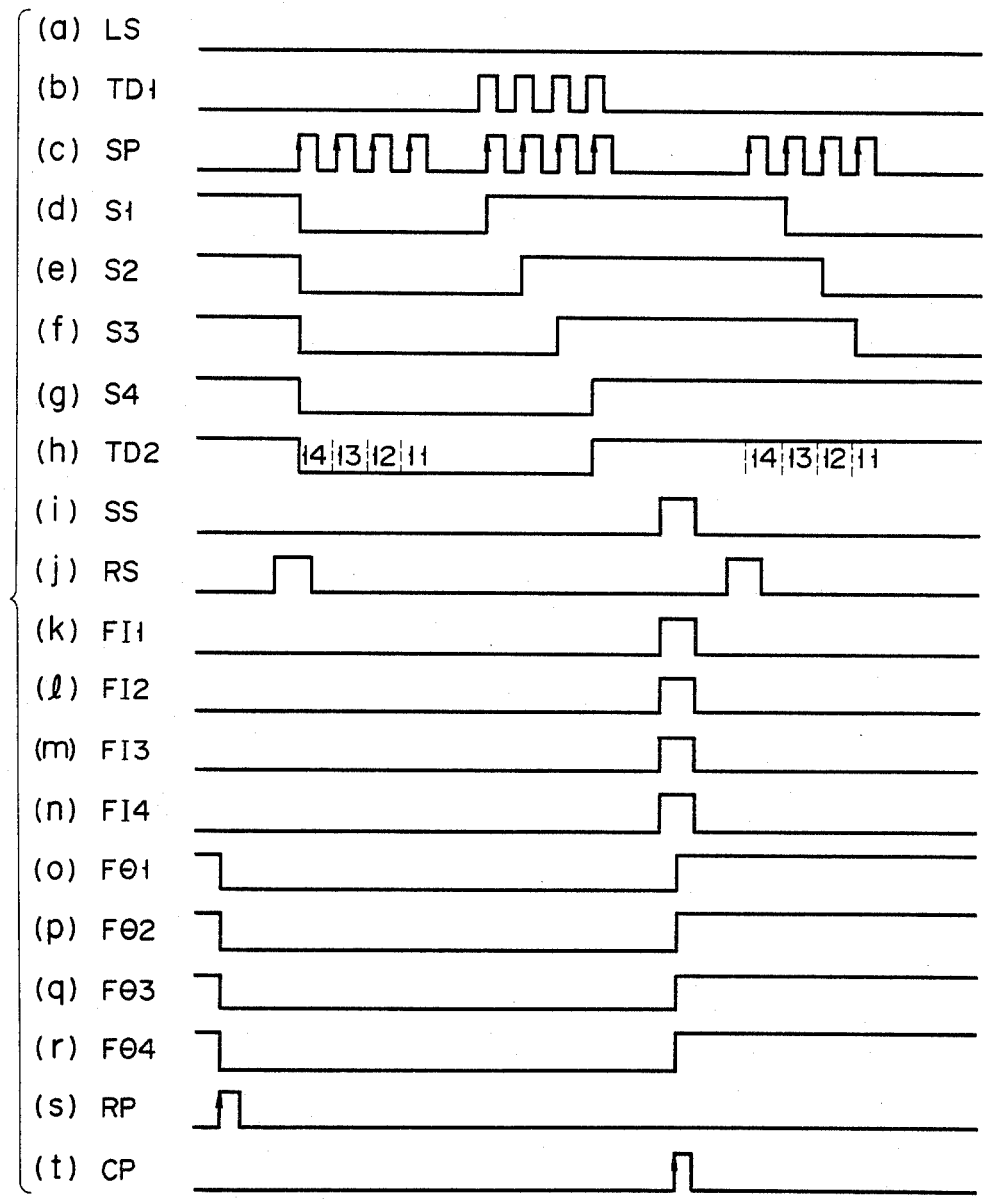
FIG. 3 is a time chart illustrating the operation of the logic circuit of FIG. 1 during testing the logic function of the flip-flops involved in the custom-circuit, showing the case where the flip-flops do not fail.

Description may now be made with reference to FIG. 3 of the operation of a logic circuit embodying this invention. In the test of a logic function, test data, for example, "1", "1", "1", "1" are supplied to the flip-flops 11 to 14 to determine the manner in which said flip-flops respond to the data received. To this end, a reset pulse is supplied to the terminal RT (FIG. 3(s)). If operated in the normal condition, each of the flip-flops 11 to 14 issues an output data "0" in response to the reset pulse. The output data from the flip-flops 11 to 14 are respectively supplied to the second input terminals of the stages 16 to 19 of the register 15. Where, at this time, the terminal R receives a high level read control signal "H" (FIG. 3(j)), the AND gates 37 of the stages 16 to 19 are rendered conducting and the AND gates 36 of the stages 16 to 19 are rendered nonconducting. Where, during this period, a shift pulse is supplied to the terminal SF (FIG. 3(c)), the flip-flops 35 of the stages 16 to 19 hold output data of the flip-flops 11 to 14 which are supplied through the AND gate 37. (FIGS. 3(d) to 3(g)). An output data of the flip-flop 14 held in the stage 19 can be measured through the data output terminal TO.

If data "0" appears at the terminal TO, at this time, it shows that the flip-flop 14 has normally carried out the reset operation. Thereafter, a low level read control signal "L" is supplied to the terminal R. In response to the read control signal "L", the AND gates 36 of the stages 16 to 19 are rendered conducting, and the AND gates 37 of the stages 16 to 19 are rendered nonconducting. Where, during this period, three shift pulses are supplied to the terminal SF (FIG. 3(c)), the flip-flops 35 of the stages 16 to 19 successively hold data received through the corresponding AND gates 36 (FIGS. 3(d) to 3(g)). The shift register 15 successively shifts those output data of the flip-flop 14 to 11 which are held in parallel in the stages 19 to 16 in response to four shift palses including the initial shift pulse, and deliver said data to the terminal TO. When it is confirmed that data "0", "0", "0", "0" have successively appeared at the terminal TO, data "1", "1", "1", "1" for testing the flip-flops 14 to 11 are supplied in series to the terminal TI (FIG. 3(b)). At this time, four shift pulses are delivered to the terminal SF (FIG. 3(c)). The read control signal at the terminal R is kept at a level "L" at least until the shifting of data is brought to an end. Consequently, the stages 16 to 19 of the shift register 15 respectively hold one-bit test data "1", "1", "1", "1" for the corresponding flip-flops 11, 12, 13, 14 (FIGS. 3(d) to 3(g)). Thereafter, a set control signal "H" is supplied to the terminal S (FIG. 3(j)). Upon receipt of an inverted signal of the set control signal "H" from the inverter 34, the AND gates 30 to 33 obstruct the passage of data through the terminals D1 to D4. In response to a set signal delivered from the terminal S, AND gates 22, 24, 26, 28 permit the passage of the test data "1" from the stages 16 to 19. The flip-flops 11 to 14 receive test data "1" through the corresponding OR gates 23, 25, 27, 29 (FIGS. 3(k) to 3(n)). Where at this time, a clock pulse is supplied to the terminal CK, each of the flip-flops 11 to 14, if normally operated, produces an output data "1" corresponding to an input data "1" (FIGS. 3(o) to 3(r)). Output data from the flip-flops 11 to 14 are supplied in parallel to the corresponding stages 16 to 19 of the shift register 15. When the read control signal "H" is supplied to the terminal R (FIG. 3(j)), the AND gates 37 involved in the stages 16 to 19 are rendered conducting, and the AND gates 36 thereof are rendered nonconducting. Where a shift pulse is supplied to the terminal SF during this period (FIG. 3(c)), the flip-flops 35 of the stages 16 to 19 respectively hold output data received from the flip-flops 11 to 14 through the corresponding AND gates 37 (FIGS. 3(d) to 3(g)). Output data from the flip-flop 14 which was held in the stage 19 appears at the terminal D8. Thereafter, the read control signal "L" is delivered to the terminal R. In response to the read control signal "L", the AND gates 36 of the stages 16 to 19 are rendered conducting, and the AND gates 37 thereof are rendered nonconducting. Where, during this interval, shift pulses are supplied to the terminal SF (FIG. 3(c)), the flip-flops 35 of the stages 16 to 19 hold data supplied through the corresponding AND gates 36. The shift register 15 successively shifts those output data from the flip-flops 14 to 11 which are held in parallel in the stages 19 to 16 in response to four shift pulses including the initial shift pulse, and sends forth the said data to the terminal TO. When it has been as certained that data "1", "1", "1", "1" have appeared in series at the terminal TO, then it can be judged that the flip-flops 11 to 14 are free from failure.

Figure 4:
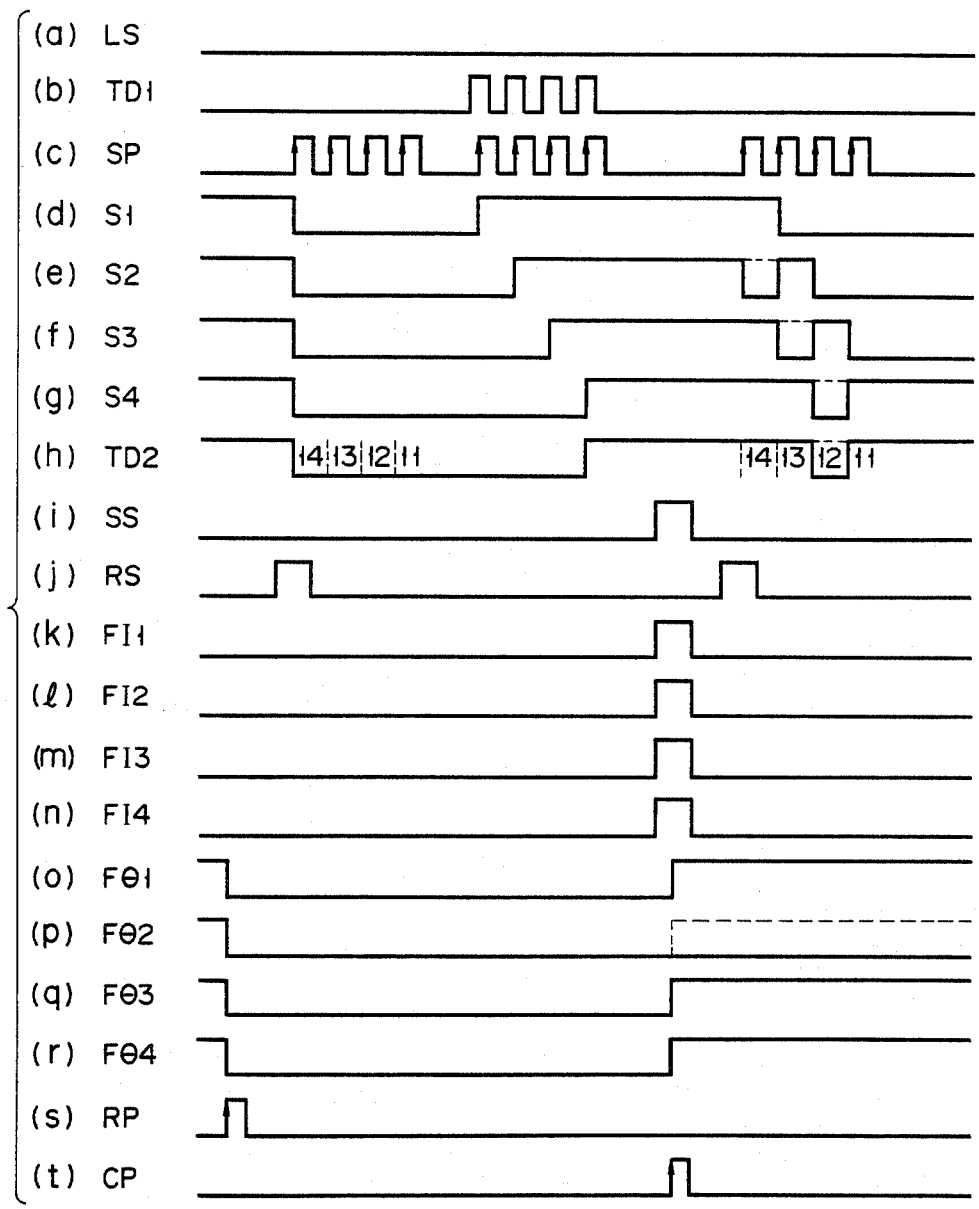
FIG. 4 is a time chart for the operation of the logic circuit of FIG. 1 during the mode of testing the logic function of the flip-flops involved in the custom-circuit, indicating the case where one of the flip-flops is out of order.

If, during the above-mentioned test, one of the flip-flops 11 to 14, for example, the flip-flops 12 gets out of order, then data "1", "1", "0", "1" appear in series at the terminal TO (FIG. 4(h)).

Where the operation speed of the LSI is tested, 4-bit series data of, for example, "1010" are held in the shift register, as in the above-mentioned case. Thereafter, a LOOP control signal "H" is continuously supplied to the terminal L. In response to the LOOP control signal "H", the AND gate 21 permits the passage of output data from the stage 19. As a result, the stage 16 receives output data from the stage 19 through said AND gate 21 and OR gate 21. Later when shift pulses are supplied to the shift register 15 at a prescribed interval, then said shift register 15 acts as a ring-oscillator. Namely, data periodically changing from "1" to "0" or vice versa are supplied to the terminal TO.

With the logic circuit embodying this invention, optional test data can be externally supplied to the flip-flops 11 to 14 of the custom-circuit. Further, the response of the flip-flops 11 to 14 to the test data can be read out to the outside. Therefore, the failure of any of the flip-flops 11 to 14 can be externally determined with case from the relationship between the input and output data. Where, during the operation of the custom-circuit, the read control signal "H" is supplied to the terminal R, output data from the flip-flops 11 to 14 which are sent forth upon receipt of the read control signal "H" are held by the shift register 15. When, therefore, the contents of the shift register 15 are read out to the terminal TO by successively carrying out shifting in said shift register 15, information can be obtained of the manner in which signals are intermediately processed by the custom-circuit. Namely, the operating condition of the gate circuits of the custom-circuit can be judged from data received in the traps provided in the flip-flops 11 to 14.

The operation speed of the custom-circuit can be detected from the A.C. characteristic of the logic circuit embodying this invention, since the custom-circuit and the logic circuit are formed on a same gate array chip.

The shift register 15 of the logic circuit embodying this invention has four stages 16 to 19. However, the number of said stages can be varied with that of the flip-flop of the custom-circuit. The subject logic circuit need not be formed on the gate array chip exclusively.

When the flip-flops 11 to 14 are only supplied with test data "1", it is possible to connect the terminal S to the first input terminals of the OR gates 23, 25, 27, 29 and connect the terminals D1 to D4 to the second input terminals of said OR gates 23, 25, 27, 29. Where, in such case, a set control signal "H" is supplied to the terminal S, test data "1" are supplied in parallel to the flip-flops 11 to 14.

As described above, the logic circuit according to this invention offers the advantages that a smaller amount of data is required than in the past to test a semiconductor chip (or custom-circuit LSI) on which a circuit involving flip-flops; the contents of the test data are simplified, thereby reducing the designers load to provide test data and facilitating the test of LSI; the more compact arrangement of the logic circuit according to this invention than the conventional type is particularly adapted to be used with the gate array.

What is claimed is:

1. A transfer circuit for defect inspection of an integrated circuit comprising:

first and second control terminals for receiving a control signal and an enable signal, respectively;

trapping means including a plurality of flip-flops which are interposed in said integrated circuit to trap intermediate data being generated therein and act as part of said integrated circuit;

shift register means, coupled to said first control terminal, and having both series and parallel input ports for receiving test data and the output data of said plural flip-flops, respectively, and selectively holding one of said test and output data in accordance with the control signal; and preset means, coupled to said second control terminal, for setting the contents of said shift register means in said plurality of flip-flops in response to the enable signal.

2. A transfer circuit according to claim 1, wherein said shift register means comprises a plurality of cascade arranged registers, each of which holds one-bit of data.

3. A transfer circuit according to claim 2, wherein said registers are D-type flip-flops.

4. A transfer circuit according to claim 2, wherein said preset means comprises a plurality of first gate circuits which respond to the enable signal and deliver data held by said registers to respective flip-flops of said trapping means.

5. A transfer circuit according to claim 4, wherein said first gate circuit includes a first AND gate having a first input terminal connected to an output terminal of said registers, a second input terminal connected to said second control terminal, and an output terminal connected to an input terminal of the flip-flops in said trapping means through an OR gate; and a second AND gate having a first input terminal to receive the intermediate data, a second input terminal to be supplied with the enable signal through an inverter, and an output terminal connected to one of the input terminals of said flip-flops in said trapping means through said OR gate.

6. A transfer circuit according to claim 2, wherein said shift register means comprises a plurality of second gate circuits which respectively provide output data of the flip-flops in said transfer means to said registers of said shift register means in response to the control signal at a first level.

7. A transfer circuit according to claim 6, wherein said second gate circuit is an AND gate having a first input terminal connected to one of the output terminals of the flip-flops in said trapping means, a second input terminal connected to the first control terminal, and an output terminal connected to one of the input terminals of the registers in said shift register means.

8. A transfer circuit according to claim 6, wherein said second gate circuit includes a first AND gate having a first input terminal supplied with one-bit data to be shifted, a second input terminal to receive the control signal through an inverter, and an output terminal connected to one of the registers in said shift register means through an OR gate; and, a second AND gate having a first input terminal supplied with output data from one of the flip-flops in said trapping means, and an output terminal connected to one of the registers in said shift register means through said OR gate.

9. A transfer circuit according to claim 1, wherein said trapping means further includes a third control terminal to which a second enable signal for resetting the flip-flops is supplied.

10. A transfer circuit according to claim 2, further comprising a third control terminal for receiving a second enable signal; and a gate circuit which responds to the second enable signal and feeds output data of the last register of said shift register means back to the initial register thereof.

11. A transfer circuit according to claim 1, which is formed on a gate array chip together with said integrated circuit.

* * * * *

UNITED STATES PATENT AND TRADEMARK OFFICE
CERTIFICATE OF CORRECTION

PATENT NO. : 4,581,740

DATED : April 8, 1986

INVENTOR(S) : Tsuneo KINOSHITA

It is certified that error appears in the above-identified patent and that said Letters Patent is hereby corrected as shown below:

Title page:

Correct the priority document number to read --226964/82--

Signed and Sealed this

Eighteenth Day of November, 1986

Attest:

DONALD J. QUIGG

*Attesting Officer*  *Commissioner of Patents and Trademarks*